United States Patent
Klose et al.

(10) Patent No.: US 10,434,342 B2
(45) Date of Patent: Oct. 8, 2019

(54) OXYGEN SUPPLY SYSTEM AND METHOD FOR TESTING AN OXYGEN SUPPLY SYSTEM

(71) Applicant: Airbus Operations GmbH, Hamburg (DE)

(72) Inventors: Peter Klose, Hamburg (DE); Frank Leuenberger, Hamburg (DE)

(73) Assignee: Airbus Operations GmbH (DE)

( * ) Notice: Subject to any disclaimer, the term of this patent is extended or adjusted under 35 U.S.C. 154(b) by 257 days.

(21) Appl. No.: 15/468,550

(22) Filed: Mar. 24, 2017

(65) Prior Publication Data

US 2017/0304661 A1    Oct. 26, 2017

(30) Foreign Application Priority Data

Apr. 22, 2016    (EP) ..................................... 16166516

(51) Int. Cl.
*A62B 25/00*    (2006.01)
*A62B 7/14*    (2006.01)
(Continued)

(52) U.S. Cl.
CPC .............. *A62B 25/005* (2013.01); *A62B 7/14* (2013.01); *A62B 18/02* (2013.01); *A62B 27/00* (2013.01); *B64D 11/00* (2013.01); *B64F 5/60* (2017.01); *B65D 43/26* (2013.01); *G01R 31/008* (2013.01); *G05B 15/02* (2013.01); *B64D 2231/02* (2013.01); *B64D 2231/025* (2013.01)

(58) Field of Classification Search
CPC ......... A62B 25/005; A62B 7/14; A62B 27/00; B64F 5/60; B64D 2231/025
See application file for complete search history.

(56) References Cited

U.S. PATENT DOCUMENTS 6,300,764 B1    10/2001    Kelley
2007/0057121 A1*    3/2007    Callahan .................. H02G 3/00
                                                                      244/118.5
(Continued)

FOREIGN PATENT DOCUMENTS

DE    10 2011 114 957 A1    4/2013
EP    0 882 484 A2    12/1998
WO    2016/054097 A1    4/2016

*Primary Examiner* — Bradley J Osinski
(74) *Attorney, Agent, or Firm* — Lerner, David, Littenberg, Krumholz & Mentlik, LLP

(57) ABSTRACT

An oxygen supply system includes a container housing having a container door, a latch controller coupled to a latch of the container door and configured to control the latch to releasably open the container door, a microcontroller coupled to the latch controller and configured to output a first latch deployment signal to the latch controller to cause the latch controller to open the latch, a pressure sensor coupled to the latch controller and configured to output a second latch deployment signal to the latch controller to cause the latch controller to open the latch, and an energy storage coupled to the microcontroller and the pressure sensor and configured to supply the microcontroller and the pressure sensor with electrical energy. The microcontroller includes built-in test equipment (BITE) configured to monitor and test the operability of one or more of the microcontroller, the latch controller, the pressure sensor and the energy storage.

12 Claims, 1 Drawing Sheet

(51) Int. Cl.

|  |  |
|---|---|
| *A62B 18/02* | (2006.01) |
| *B65D 43/26* | (2006.01) |
| *G05B 15/02* | (2006.01) |
| *A62B 27/00* | (2006.01) |
| *B64D 11/00* | (2006.01) |
| *G01R 31/00* | (2006.01) |
| *B64F 5/60* | (2017.01) |

(56) References Cited

U.S. PATENT DOCUMENTS

| 2010/0012116 A1 | 1/2010 | Rittner et al. |
| 2012/0205491 A1 | 8/2012 | Rittner et al. |
| 2014/0309811 A1 | 10/2014 | Mueller et al. |
| 2016/0090192 A1* | 3/2016 | Dunn ................. B64D 11/0015 340/945 |

* cited by examiner

OXYGEN SUPPLY SYSTEM AND METHOD FOR TESTING AN OXYGEN SUPPLY SYSTEM

FIELD OF THE INVENTION

The present invention pertains to an oxygen supply system and a method for testing an oxygen supply system, particularly for use in a passenger aircraft.

BACKGROUND OF THE INVENTION

Oxygen supply systems in aircraft are designed to store or to generate a supply of pure oxygen and to regulate, dilute as required and then distribute oxygen to crew or passengers. Oxygen supply systems may be installed in military aircraft, commercial aircraft and business aircraft. Depending on the type and the role of the aircraft concerned oxygen supply systems may be used under normal operating conditions or under emergency or other extraordinary operating conditions to provide supplemental oxygen in specific flight situations.

In order to ascertain correct functionality of the oxygen supply systems, a number of tests may be performed.

Document EP 0 882 484 A2 discloses an oxygen concentrator with adsorption beds' duty cycle control and self-test. Document US 2010/0012116 A1 discloses an oxygen breathing device having a built-in test feature for monitoring an oxygen performance of a filter unit. Document US 2007/0057121 A1 discloses a supplemental oxygen system as line-replacable unit being powered using a diod bridge such that the supplemental oxygen system is powered in either forward or reverse polarity. Document U.S. Pat. No. 6,300,764 B1 discloses a squib fire network including built-in testing which is able to safely and efficiently verify the proper operational status of the squib fire network. Document DE 10 2011 114 957 A1 discloses a control device for activating an oxygen supply of an with a first activation unit which is configured to activate at least a part of the oxygen supply by wireless transmission of a first activation signal.

BRIEF SUMMARY OF THE INVENTION

An aspect of the invention may provide an oxygen supply system which is easier to monitor, less complex in maintenance and/or may be implemented with less wiring effort.

According to a first aspect of the invention, an oxygen supply system comprises a container housing having a container door, a latch controller coupled to a latch of the container door and configured to control the latch to releasably open the container door, a microcontroller coupled to the latch controller and configured to output a first latch deployment signal to the latch controller to cause the latch controller to open the latch, a pressure sensor coupled to the latch controller and configured to output a second latch deployment signal to the latch controller to cause the latch controller to open the latch, and an energy storage coupled to the microcontroller and the pressure sensor, the energy storage being configured to supply the microcontroller and the pressure sensor with electrical energy. The microcontroller includes built-in test equipment (BITE), the BITE being configured to monitor and test the operability of one or more of the microcontroller, the latch controller, the pressure sensor and the energy storage.

According to a second aspect of the invention, a method for testing an oxygen supply system comprises the steps of triggering a test routine of a built-in test equipment (BITE) in a microcontroller of the oxygen supply system, monitoring and testing, by the BITE, the operability of one or more of the microcontroller, a latch controller, a pressure sensor and an energy storage of the oxygen supply system, and outputting, by the microcontroller, a testing result signal via data interface of the oxygen supply system.

According to a third aspect of the invention, an aircraft, in particular a passenger aircraft, may comprise an oxygen supply system according to the first aspect of the invention. The aircraft may in some embodiments include an oxygen supply system installed in a passenger cabin of the aircraft, for example as a line-replaceable unit (LRU).

One of the ideas of the present invention is to integrate a microcontroller using smart control logic into the container of an oxygen supply unit that allows monitoring and testing, particularly remote testing, of the whole system and/or single components thereof. With built-in test equipment (BITE) in the microcontroller, the system status may be easily and continuously monitored and communicated to HUMS of the aircraft.

A particular advantage of the oxygen supply system according to an embodiment of the invention is the reduced wiring effort for the oxygen supply units since no additional or redundant wiring apart from the wiring for the cabin management system is needed. The maintenance efforts are considerably reduced due to the oxygen supply units being capable of performing built-in self-tests. The monitoring of components of the oxygen supply system via a microcontroller and a connected network data bus enhances the range of control functions for the oxygen supply system and allows for testing and activating/deactivating individual oxygen supply units. Each of such oxygen supply units may include an autarkic backup operation mode that enables normal operation via a lower design assurance level.

Advantageous variations and developments may be gathered from the dependent claims as well as from the description in conjunction with the drawings.

According to some embodiments, the oxygen supply system may further comprise an OR-gate coupled between the microcontroller, the latch controller and the pressure sensor, the OR-gate being configured to output a logically high latch control signal to the latch controller, if either or both of the first latch deployment signal and second latch deployment signal are logically high.

According to some further embodiments, the oxygen supply system may further comprise a power supply interface coupled to the energy storage and configured to receive power for electrically charging the energy storage.

According to some further embodiments, the oxygen supply system may further comprise a data interface coupled to the microcontroller and configured to connect the oxygen supply system to a data network.

According to some further embodiments, the oxygen supply system may further comprise oxygen supply equipment contained in the container housing and configured to be at least partially accessible from outside the container housing upon deployment of the container door. The oxygen supply equipment may include movable components, such as oxygen face masks, and stationary components, such as oxygen generators.

According to some further embodiments, the BITE may be further configured to perform built-in self tests, BISTs, of one or more of the microcontroller, the latch controller, the pressure sensor and the energy storage.

According to some further embodiments, the BITE may be further configured to perform a power-on self test, POST, of one or more of the microcontroller, the latch controller, the pressure sensor and the energy storage upon powering up of the oxygen supply system.

According to some further embodiments, the BITE may be further configured to activate a limp mode of the oxygen supply system upon determination that the operability of one or more of the microcontroller, the latch controller, the pressure sensor and the energy storage deviates from a predetermined operability level.

According to some further embodiments, the microcontroller may be configured to monitor the charging status of the energy storage and to output an energy storage status signal indicative of the monitored charging status of the energy storage.

According to some embodiments, the method may further comprise activating, by the microcontroller, a limp mode of the oxygen supply system upon determination that the operability of one or more of the microcontroller, the latch controller, the pressure sensor and the energy storage deviates from a predetermined operability level.

BRIEF DESCRIPTION OF THE DRAWINGS

The invention will be explained in greater detail with reference to exemplary embodiments depicted in the drawings as appended.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Although specific embodiments have been illustrated and described herein, it will be appreciated by those of ordinary skill in the art that a variety of alternate and/or equivalent implementations may be substituted for the specific embodiments shown and described without departing from the scope of the present invention. Generally, this application is intended to cover any adaptations or variations of the specific embodiments discussed herein.

Figure 1:
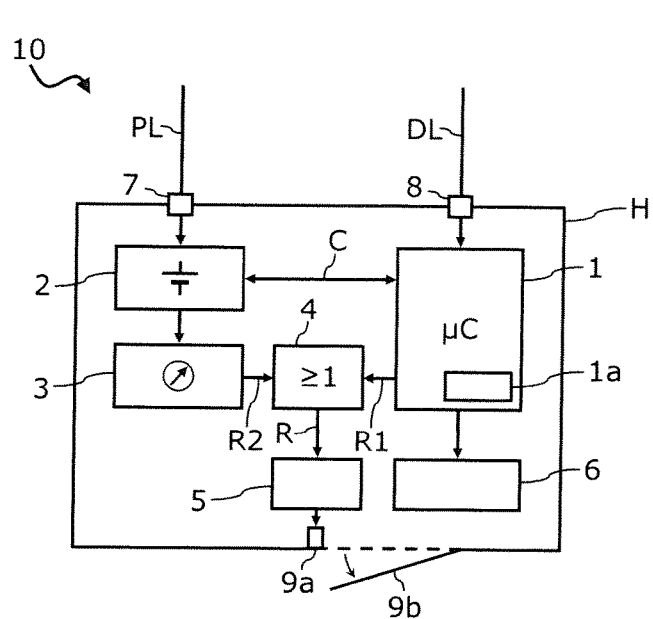
FIG. 1 schematically illustrates an oxygen supply system according to an embodiment.
Figure 3:
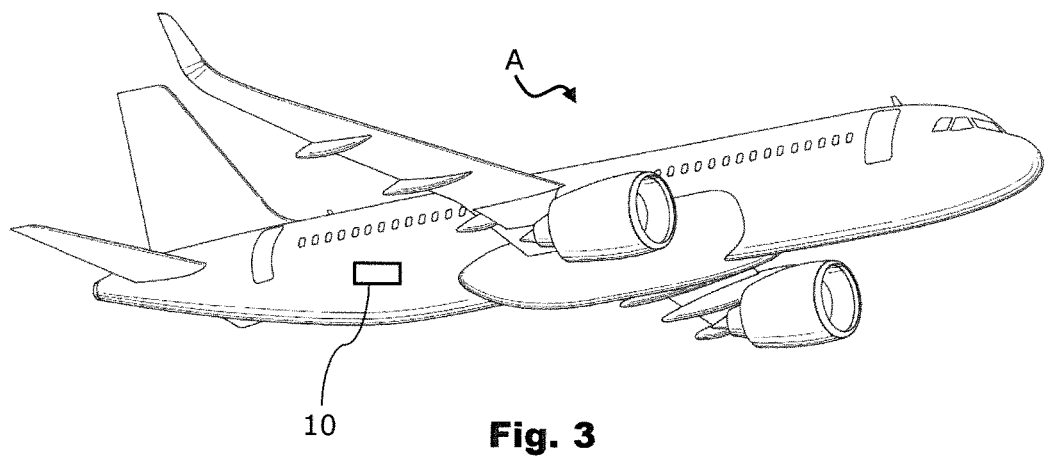
FIG. 3 schematically illustrates an aircraft including an oxygen supply system according to yet another embodiment.

FIG. 1 schematically illustrates a block diagram of an oxygen supply system 10 for use in an aircraft, such as for example the aircraft A as depicted in FIG. 3. The oxygen supply system 10 may for example be a supplementary oxygen supply system 10 installed in the passenger cabin of a passenger aircraft. The oxygen supply system 10 may be implemented as a line-replaceable unit (LRU) that may be designed to specifications assuring ease of interchangeability, attachment and mountability. The oxygen supply system 10 may be equipped with standardized connections for rapid mechanical mounting, data communication, power supply and grounding. The oxygen supply system 10 may be implemented in concordance with a Design Assurance Level C or a Design Assurance Level B according to the RTCA SC-167 guidelines DO-178B.

The oxygen supply system 10 may generally include oxygen supply equipment 6, such as oxygen masks for the passengers that are provided at various locations in an aircraft, for example above the passenger seats, in the toilets, at the stations of the flight crew and in the galleys of the aircraft. Oxygen supply for the passengers may be provided in one or more of different ways: For example, the oxygen for the passengers may be produced by chemical oxygen generators. The oxygen generators may be connected to the masks via flexible tubes. Alternatively or additionally to the use of oxygen generators, the oxygen may also be stored in oxygen cylinders and delivered as required.

Irrespective of how the oxygen supply to the passengers is ensured, the oxygen supply provided by the oxygen supply system 10 may in emergency cases or under exceptional flight circumstances be activated either manually, e.g., from the cockpit, or automatically, for example if the pressure in the cabin drops to a predetermined limit value. The limit value may, for example, be comparable to the pressure at an altitude of about 14.500±500 feet.

For deployment of the oxygen supply equipment 6, the oxygen supply system 10 may be installed in a container with a container housing, generally indicated with the reference sign H. The container housing H includes a container door 9b and a corresponding latch 9a. Further, the container housing includes a microcontroller 1 with Built-in Test Equipment (BITE) 1a, an energy storage 2 coupled to the microcontroller via a control signal line C and a pressure sensor 3 coupled to the energy storage 2. The pressure sensor 3 and the microcontroller 1 may have output terminals for control signals R1 and R2 coupled to an OR-gate 4 of the oxygen supply system 10 which in turn outputs signals to a latch controller 5. The latch controller 5 is coupled to the latch 9a and is configured to control the latch 9a to releasably open the container door 9b.

The activation of the oxygen supply equipment 6 may, for example, be automatically or manually initiated. As soon as the oxygen supply is activated, the container door 9b of the container housing H is opened and the oxygen masks of the oxygen supply equipment 6 may fall out. The space in which the oxygen masks for the passengers are stored may also be referred to as an oxygen (mask) container. At the moment when the passengers have pulled the masks towards them, the oxygen supply is triggered, that is to say for example the oxygen generators are started.

The container door 9b of the container housing H is normally kept closed by the electrically operated latch 9a and a corresponding lock (not explicitly illustrated). As soon as the latch 9a receives an logically active latch control signal R, the lock is released and the container door 9b is opened, for example via a tensioned spring. For manual deployment, the microcontroller is configured to output a first latch deployment signal R1 to the latch controller 5 via the OR-gate 4 to cause the latch controller 5 to open the latch 9a. For automatic deployment, the pressure sensor 3 is configured to output a second latch deployment signal R2 to the latch controller 5 via OR-gate 4 to cause the latch controller 5 to open the latch 9a.

The OR-gate 4 is coupled between the microcontroller 1, the latch controller 5 and the pressure sensor 3 and outputs the logically high latch control signal R to the latch controller 5, if either or both of the first latch deployment signal R1 and second latch deployment signal R2 are logically high. In other words, either of the manual and the automatic deployment scheme may guarantee activation of the oxygen supply independently from each other.

The energy storage 2 is designed to supply the pressure sensor 3, the latch controller 5 and the microcontroller 1 with electrical energy. The energy storage 2 may have a capacity that is sufficient to supply the oxygen supply system components for at least one flight leg, even if the external power supply fails. The energy storage 2 comprises a power supply interface 7 over which the oxygen supply system 10 is connected to an external power supply of the aircraft A vie a power supply line PL. the energy storage 2 may for example include a rechargeable battery or a capacitor.

Oxygen supply systems that are designed for emergency systems are usually activated via an extensive wired cabling. In the normal state, i.e., when no activation of the oxygen system occurs, the cables are currentless and are regularly tested. To achieve a defined availability, generally a substantially greater number of cables are installed than would be necessary for simple activation. This means that the cabling is designed to be redundant to guarantee the required availability.

In the oxygen supply system 10, the microcontroller 1 includes built-in test equipment (BITE), i.e. passive fault management and diagnosis tools built into the system to support a maintenance process. The BITE may for example include multimeters, oscilloscopes, discharge probes, and/or frequency generators that are provided as part of the microcontroller 1 to enable testing and perform diagnostics. The BITE 1*a* is generally configured to monitor and test the operability of one or more of the components of the oxygen supply system 10, i.e. for example the microcontroller 1 itself, the latch controller 5, the pressure sensor 3 and/or the energy storage 2.

The microcontroller 1 may be connected to a data network of the aircraft via a data line DL that may be coupled to a data interface 8 of the oxygen supply system 10. Upon request from the data network via the data line DL, the BITE 1*a* may for example be configured to perform built-in self tests, BISTs, or power-on self tests, POSTs. It may also be possible for the BITE 1*a* to perform those BISTs and POSTs automatically in regular pre-defined intervals or in the event of certain operating conditions of the oxygen supply system 10.

If the BITE 1*a* determines that the operability of one or more of the microcontroller 1, the latch controller 5, the pressure sensor 3 and the energy storage 2 deviates from a predetermined operability level, the BITE 1*a* (or the microcontroller on behest of the BITE 1*a*) may be configured to activate a limp mode of the oxygen supply system 10, i.e. a temporary operational mode of limited functionality that may bridgeover the time until the oxygen supply system 10 or its respective faulty components may be replaced or repaired. The microcontroller 1 may further monitor the charging status of the energy storage 2 and output an energy storage status signal indicative of the monitored charging status of the energy storage 2, for example via the data interface 8 to the data network of the aircraft A.

By providing the oxygen supply system 10 with the BITE 1*a*, the cabling effort may be significantly reduced and the oxygen supply system 10 may be operated as a fully autarkic system with backup operation functionality.

Figure 2:
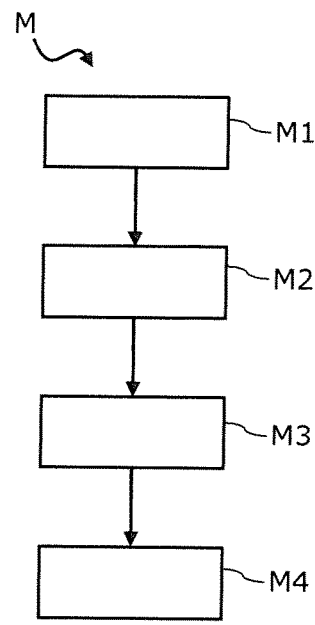
FIG. 2 schematically illustrates a method for testing an oxygen supply system according to another embodiment.

FIG. 2 schematically illustrates a block diagram of procedural stages in a method M for testing an oxygen supply system. The method M may in particular be used for testing an oxygen supply system 10 as illustrated and explained in conjunction with FIG. 1. For example, the method M may be implemented for testing an oxygen supply system 10 in an aircraft A including one or more oxygen supply system 10 as exemplarily illustrated in conjunction with FIG. 3. The aircraft A of FIG. 3 may for example make use of the method M for testing supplementary oxygen supply systems in the passenger cabin.

In a first step M1, the method M includes triggering a test routine of a built-in test equipment, BITE 1*a*, in a microcontroller 1 of the oxygen supply system 10. The Bite 1*a* then monitors and tests in a second step M2 the operability of one or more of the microcontroller 1, a latch controller 5, a pressure sensor 3 and an energy storage 2 of the oxygen supply system 10. Finally, the microcontroller outputs in a third step M3 a testing result signal via data interface 8 of the oxygen supply system 10, the testing result signal being indicative of the monitoring and testing results as evaluated by the BITE 1*a*.

The BITE 1*a* may perform BISTs and POSTs during monitoring and testing the components of the oxygen supply system 10. The BISTs and POSTs may either be scheduled automatically according to a predefined monitoring and testing scheme, or they may be initiated manually by maintenance personnel and/or the cockpit crew of the aircraft A.

Optionally, the method M may further comprise a fourth step M4 of activating a limp mode of the oxygen supply system 10 upon determination that the operability of one or more of the microcontroller 1, the latch controller 5, the pressure sensor 3 and the energy storage 2 deviates from a predetermined operability level. The limp mode may be activated by the microcontroller 1 to ensure adequate bridgeover functionality of the oxygen supply system 10 until repair and maintenance may be performed on the defective oxygen supply system 10. The limp mode may be designed to ensure proper functionality of the oxygen supply system 10 for at least one flight leg of the aircraft A.

In the foregoing detailed description, various features are grouped together in one or more examples or examples with the purpose of streamlining the disclosure. It is to be understood that the above description is intended to be illustrative, and not restrictive. It is intended to cover all alternatives, modifications and equivalents. Many other examples will be apparent to one skilled in the art upon reviewing the above specification.

The embodiments were chosen and described in order to best explain the principles of the invention and its practical applications, to thereby enable others skilled in the art to best utilize the invention and various embodiments with various modifications as are suited to the particular use contemplated. In the appended claims and throughout the specification, the terms "including" and "in which" are used as the plain-English equivalents of the respective terms "comprising" and "wherein," respectively. Furthermore, "a" or "one" does not exclude a plurality in the present case.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An oxygen supply system comprising:
   a container housing having a container door;
   a latch controller coupled to a latch of the container door and configured to control the latch to releasably open the container door;
   a microcontroller coupled to the latch controller and configured to output a first latch deployment signal to the latch controller to cause the latch controller to open the latch;
   a pressure sensor coupled to the latch controller and configured to output a second latch deployment signal to the latch controller to cause the latch controller to open the latch; and
   an energy storage coupled to the microcontroller and the pressure sensor, the energy storage being configured to supply the microcontroller and the pressure sensor with electrical energy,
   wherein the microcontroller includes built-in test equipment (BITE), the BITE being configured to monitor and test the operability of one or more of the microcontroller, the latch controller, the pressure sensor and the energy storage.

2. The oxygen supply system of claim 1, further comprising:
   an OR-gate coupled between the microcontroller, the latch controller and the pressure sensor, the OR-gate being configured to output a logically high latch control signal to the latch controller, if either or both of the first latch deployment signal and second latch deployment signal are logically high.

3. The oxygen supply system of claim 1, further comprising:
   a power supply interface coupled to the energy storage and configured to receive power for electrically charging the energy storage.

4. The oxygen supply system of claim 1, further comprising:
   a data interface coupled to the microcontroller and configured to connect the oxygen supply system to a data network.

5. The oxygen supply system of claim 1, further comprising:
   oxygen supply equipment contained in the container housing and configured to be at least partially accessible from outside the container housing upon deployment of the container door.

6. The oxygen supply system of claim 1, wherein the BITE is further configured to perform built-in self tests (BISTs) of one or more of the microcontroller, the latch controller, the pressure sensor and the energy storage.

7. The oxygen supply system of claim 1, wherein the BITE is further configured to perform a power-on self test (POST) of one or more of the microcontroller, the latch controller, the pressure sensor and the energy storage upon powering up of the oxygen supply system.

8. The oxygen supply system of claim 1, wherein the BITE is further configured to activate a temporary operational mode of the oxygen supply system upon determination that the operability of one or more of the microcontroller, the latch controller, the pressure sensor and the energy storage deviates from a predetermined operability level.

9. The oxygen supply system of claim 1, wherein the microcontroller is configured to monitor a charging status of the energy storage and to output an energy storage status signal indicative of the monitored charging status of the energy storage.

10. An aircraft comprising an oxygen supply system, the oxygen supply system comprising:
    a container housing having a container door;
    a latch controller coupled to a latch of the container door and configured to control the latch to releasably open the container door;
    a microcontroller coupled to the latch controller and configured to output a first latch deployment signal to the latch controller to cause the latch controller to open the latch;
    a pressure sensor coupled to the latch controller and configured to output a second latch deployment signal to the latch controller to cause the latch controller to open the latch; and
    an energy storage coupled to the microcontroller and the pressure sensor, the energy storage being configured to supply the microcontroller and the pressure sensor with electrical energy,
    wherein the microcontroller includes built-in test equipment (BITE), the BITE being configured to monitor and test the operability of one or more of the microcontroller, the latch controller, the pressure sensor and the energy storage.

11. The aircraft of claim 10, wherein the oxygen supply system is implemented as a line-replacable unit (LRU).

12. The aircraft of claim 10, wherein the aircraft is a passenger aircraft.

* * * * *